United States Patent

[11] 3,584,270

[72] Inventor John Philips
Monroeville, Pa.

[21] Appl. No. 712,842
[22] Filed Mar. 13, 1968
[45] Patented June 8, 1971
[73] Assignee Westinghouse Electric Corporation
Pittsburgh, Pa.

[54] HIGH SPEED SWITCHING RECTIFIER
9 Claims, 7 Drawing Figs.

[52] U.S. Cl. .......... 317/235, 307/303;324, 317/234
[51] Int. Cl. .......... H01l 9/00, H01l 9/12
[50] Field of Search .......... 317/234, 235, 30, 40, 41, 41.1, 44, 235 4B; 307/303, 324

[56] References Cited

UNITED STATES PATENTS

| | | | |
|---|---|---|---|
| 2,971,139 | 2/1961 | Noyce | 317/235 |
| 3,476,993 | 11/1969 | Aldrich et al | 317/235 |
| 3,264,492 | 8/1966 | Gault | 307/88.5 |
| 3,437,889 | 4/1969 | Eugster | 317/235 |

*Primary Examiner*—John W. Huckert
*Assistant Examiner*—R. F. Polissacic
*Attorneys*—F. Shapoe and C. L. Menzemer

ABSTRACT: This disclosure sets forth a four region, three junction, two terminal semiconductor device, designated as a reverse switching rectifier, in which a PNPN (or NPNP) device is surrounded by an NP (or PN) device. Electrically, the NP device is in parallel with the PNPN device. In the device so constructed, breakover and switching occurs in only the PNPN (or NPNP) device by either an avalanche or punch-through mechanism.

WITNESSES
Edwin E. Bassler
Leroy M. Garman

INVENTOR
John Philips
BY
C. L. Menzemer
ATTORNEY

HIGH SPEED SWITCHING RECTIFIER

BACKGROUND OF THE INVENTION

In operation of semiconductor junction rectifiers, the rated peak reverse voltage must not be exceeded, even momentarily, or the rectifier may be destroyed. The avalanche diode has decreased the vulnerability of the rectifier to reverse voltage transients by spreading the breakdown process or avalanching more uniformly over the device area and thus increasing power dissipation capability over that of conventional diodes. However, the avalanche process still occurs in tiny, discrete areas, and the transient voltages must not last very long or the diode will also be destroyed. A better solution to the problem of protecting the rectifier is to have the device switch from a high impedance blocking state to a low impedance conducting state when a specified voltage is exceeded. If this self-protecting reverse characteristic is now combined with a normal forward conducting state, all of the advantages of a normal rectifier will be retained, thus greatly increasing operational reliability.

An object of this invention is to provide a rectifier having a reverse characteristic such that the device is capable of switching from a high impedance blocking state to a low impedance conducting state when a specific voltage is exceeded.

Another object is to provide a rectifier having a normal forward conducting state and a reverse state that switches from a blocking state to a conducting state at a specific voltage.

Other objects will be obvious and will appear hereinafter.

SUMMARY OF THE INVENTION

This invention provides a semiconductor device of the junction rectifier type designated as a reverse switching rectifier consisting of a body of semiconductor material. The body is divided into a central portion and a peripheral portion. The central portion being comprised of a four region three junction device and the peripheral portion being comprised of a two region one junction device. Electrically, the two region one junction device is in parallel with the four region three junction device. The two devices are so coordinated that any avalanche breakdown or punch-through will occur only through the four region device.

DESCRIPTION OF THE DRAWINGS

For a better understanding of the nature and objects of the invention, reference should be had to the following description and drawings, in which.

DESCRIPTION OF THE PREFERRED EMBODIMENT

The device of this invention is a reverse switching rectifier comprising in combination and in a single body, a PN junction diode in a parallel circuit relationship with a PN–PN switching device. This relationship is shown schematically in FIG. 1.

Figure 2:
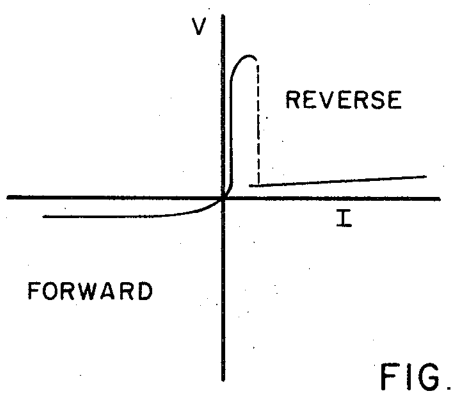
FIG. 2 is a curve showing the I—V characteristics of the device of this invention.

In the forward direction, the device conducts as a normal junction rectifier. In the reverse direction, the device of this invention blocks the flow of current until a certain voltage is exceeded, at which point it switches rapidly until the voltage or current is reduced essentially to zero. This operating characteristic is shown graphically in FIG. 2.

Figure 3:
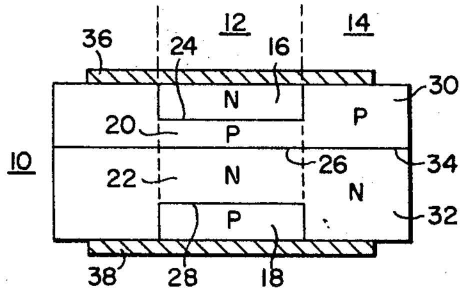
FIG. 3 is a schematic drawing of the device of this invention.

With reference to FIG. 3, there is shown a schematic diagram of a basic device 10 of this invention contained within a single body of semiconductor material.

The basic device 10 of FIG. 3 has a central portion 12, enclosed between the dotted lines, consisting of a four region, three junction switching device and a peripheral portion 14 consisting of a junction type diode.

For purposes of simplicity of explanation, the central portion 12 is illustrated and will be described as an NPNP device and the diode as a PN device.

The switching device which comprises the central portion 12 has a cathode emitter 16 and an anode emitter 18 and base regions 20 and 22. There is a PN junction 24 between the cathode emitter region 16 and base 20, a PN junction 26 between base regions 20 and 22 and a PN junction 28 between base region 22 and anode emitter 18.

The junction diode device which comprises the peripheral portion 14 has a first region 30, a second region 32 and a PN junction 34 disposed therebetween.

As is obvious from FIG. 3, region 30 of the diode is the peripheral extension of base region 20 of the switching device, region 32 of the diode is the peripheral extension of base region 22 of the switching device and PN junction 34 of the diode is the same as junction 26 of the switching device.

There is a first ohmic contact 36 affixed to both cathode emitter region 16 and region 30 and a second ohmic contact 38 affixed to both anode emitter region 18 and region 32.

The two continuous central regions 20—30 and 22—32 of the device permits leakage currents generated at high temperatures in the center regions to flow out the ohmic contacts 36 and 38 rather than only through the emitter regions 16 and 18 which can cause premature switching.

The method of shorting one emitter-base region of a PNPN device is known, however, the device of this invention shorts both emitter-base regions.

Two types of devices have been built utilizing the principles of this invention. The difference between the two devices is in the switching mechanism employed. In one case, the device is switched using the current generated by the avalanche mechanism, and in the other case, the switching is achieved by a punch-through current multiplication effect.

Figure 4:
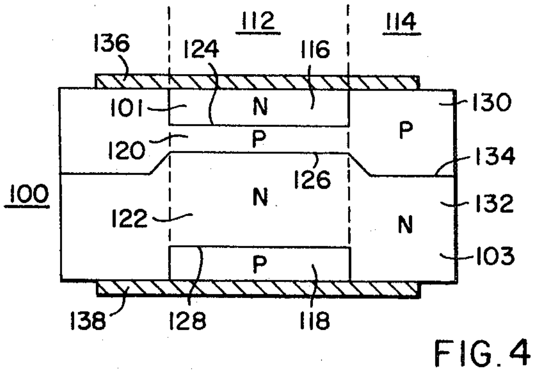
FIGS. 4 to 6 are side views, in section, of the device of this invention.

With reference to FIG. 4, there is illustrated a device 100 incorporating the teachings of this invention which switches from a high impedance blocking state to a low impedance conducting state when a specified voltage is exceeded. The device 100 of FIG. 4 is switched by the current generated by the avalanche mechanism.

The device 100 of FIG. 4 consists of a central portion 112, enclosed between the dotted lines, consisting of a four region, three junction switching device 101 and a peripheral portion 114 consisting of a junction type diode 103.

For simplicity the switch 101 will be denoted as a NPNP device and the diode 103 as a PN device.

The switching device portion 101 has a cathode emitter 116, an anode emitter 118 and base regions 120 and 122. There is a PN junction 124 between the cathode emitter region 116 and base region 120, a PN junction 126 between base regions 120 and 122 and a PN junction 128 between base region 122 and anode emitter 118.

The diode device portion 103 has a first region 130, a second region 132 and a PN junction 134 disposed therebetween.

As is obvious from FIG. 4, region 130 of the diode 103 is the peripheral extension of base region 120 of the switching device 101. However, the peripheral portion, region 130, is at least 10 percent to 20 percent and preferably, from 30 percent to 50 percent thicker than region 120. The importance of this will be explained later. Region 132 of diode portion 103 is the peripheral extension of region 122 of the switching device 101. In addition PN junction 134 between regions 130 and 132 of the diode device 103 is a continuation of the PN junction 126 of the switch device 101.

There is a first ohmic contact 136 affixed to both regions 116 and 130 and electrically shorting the two regions and a second ohmic electrical contact 138 affixed to both regions 118 and 132 and electrically shorting these two regions.

The PN junction 126—134 is formed in two separate steps to get two different avalanche voltages The peripheral portion 134 is diffused for a longer time and is from 10 percent to 50 percent deeper than the central portion, junction 126, although approximately the same surface concentration of diffusant is used in each case. Consequently, region 126 has a higher built-in electrical field and thus has a lower avalanche voltage than region 134. Therefore, when voltage is applied, junction 126 will break down first and switch reliably because it is in the PNPN portion of the device. Another feature of this structure is that the PNPN switching region is entirely surrounded by a PN junction, junction 134, which avalanches at a higher voltage, thus contributing to the reliability of switching by putting less electrical stress on the junction at the surface during normal operation.

In a typical device of the type shown in FIG. 4, N-type region 116 has a thickness of about 0.5 mil and is doped to a concentration of from $10^{17}$ to $10^{21}$ carriers per cubic centimeter; P-type region 120 has a thickness of about 0.5 mil and a doping concentration of $10^{14}$ to $10^{18}$ carriers per cubic centimeter; N-type region 122 a thickness of about 7 mils and doped to an average concentration of from $10^{13}$ to $10^{16}$ carriers per cubic centimeter; P-type region 118 a thickness of about 1.2 mils and doped to a concentration of about $10^{17}$ to $10^{21}$ carriers per cubic centimeter. P-type region 130 has a thickness of about 1.2 mils and is doped to a concentration of from $10^{15}$ to $10^{18}$ carriers per cubic centimeter and N-type region 132 has a thickness of about 8 mils and a doping concentration of from $10^{13}$ to $10^{16}$ carriers per cubic centimeter.

It is the important feature of the device of FIG. 4 that the doping concentration is such that the avalanche voltage of the central portion is less than the avalanche voltage of the peripheral portion.

Figure 5:
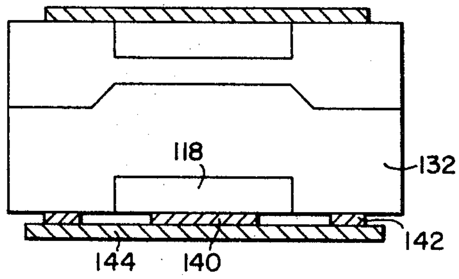

With reference to FIG. 5, if desired rather than electrically shorting regions 118 and 132 by employing a single electrical ohmic contact as shown in FIG. 4, a first ohmic contact 140, comprised of for example, a gold-boron is affixed to region 118 and a second ohmic contact 142, comprises of for example, a gold-antimony alloy is affixed to region 132 and the two ohmic contacts are then electrically shorted through a molybdenum contact 144 which contacts both ohmic contacts 140 and 142.

Two silicon devices of the type shown in FIG. 4 were prepared using known diffusion and masking techniques.

In one device thus prepared N-type region 116 had a thickness of 0.5 mil; P-type region 120 a thickness of 0.7 mil; N-type region 122 a thickness of 7 mils and P-type region 118 a thickness of 1 mil. The resistivity of the N-type region 122 was 15 ohm-cm. This device had a breakover voltage of 700 volts.

In a second device thicknesses and resistivities were identical to the first device except that the resistivity of the N-type region 122 was 50 ohm-cm. This device has a breakover voltage of 1500 volts.

Figure 6:
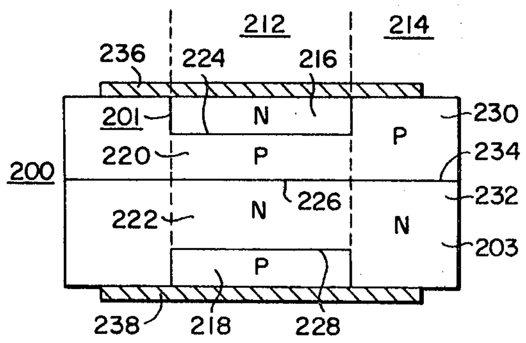

With reference to FIG. 6, there is illustrated a device 200 incorporating the teachings of this invention which switches from a high impedance blocking state to a low impedance conducting state when a specific voltage is exceeded. The device 200 of FIG. 6 is switched by the current multiplication induced by approaching the punch-through voltage.

The device 200 consists of a central portion 212, denoted by the area between the dotted lines, and a peripheral portion 214.

Figure 1:
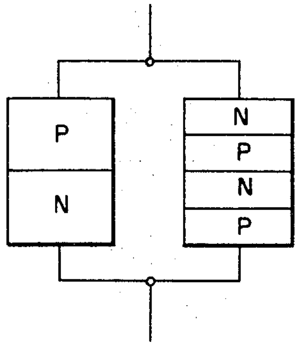
FIG. 1 is a schematic diagram showing the electrical circuit relationship between the two portions of the device of this invention.

The central portion 212 is a four region, three junction switching device 201. The peripheral portion 214 is a two region, one junction diode 203. Electrically, the diode is in parallel with the switching device as shown in FIG. 1.

For simplicity of explanation the switch 201 will be denoted as a NPNP device and the diode 203 as a PN device.

The central portion 212, which comprises the switching device 201, consists of a cathode emitter region 216, and an anode emitter region 218, a first base region 220, and a second base region 222. There is a PN junction 224 between regions 216 and 220, a PN junction 226 between regions 220 and 222 and a PN junction 228 between regions 222 and 218.

The peripheral portion 214, which is the diode device 203, consisting of a first region 230 and a second region 232 with a PN junction 234 between regions 230 and 232.

As is obvious from FIG. 6, region 230 of device 203 is a peripheral extension of region 220 of device 201 and region 232 of device 203 is a peripheral extension of region 222 of device 201. In each case however, regions 230 and 232 are of a greater thickness than regions 220 and 222 respectively.

As is also obvious from FIG. 6, PN junction 234 in peripheral portion 214 is an extension of PN junction 226 of portion 212.

A first metal electrical contact 236 of for example, molybdenum, aluminum, gold, silver, tantalum and base alloys thereof is affixed to the top surface of the device 200. The contact 236 is disposed over region 216 and over at least a portion of region 230.

A second metal electrical contact 238 of the same material as contact 236 is affixed to the bottom surface of the device 200. The contact 238 is disposed over region 218 and over at least a portion of region 232.

In this embodiment of the invention, the switching is accomplished by choosing a resistivity and base width for the base region 222 which fixes a certain punch-through voltage. The punch-through voltage is in all cases significantly lower than the avalanche voltage of junction 226—234. The punch-through voltage can be two to five times or more lower than the avalanche voltage. The resistivity of the base region 222 is deliberately chosen to avoid the generation of any avalanche current. The switching takes place when the advancing junction 226, depletion region under reverse voltage bias makes the N-type base region 222 of the PNP transistor, consisting of P-type region 218, N-type region 222 and P-type region 220, very small with a resultant increase in alpha or gain. This gain then effectively multiplies the basic leakage current of junction 226 resulting in a very large leakage current just before the junction 226 depletion region touches junction 228. The large current flow should be quite uniform over the entire switching device area; and when it reaches a critical desired value the device switches.

The effect of the thickness and resistivity of the second base region on the characteristics of the device can be shown by comparing two silicon devices made in accordance with the teachings of this invention.

In the first device, region 220 had a thickness of 1 mil, region 222 a thickness of 6 mils and a resistivity of 200 ohm-cm., region 218 a thickness of 0.5 mil and region 216 a thickness of 0.5 mil. The device had a switching voltage of 350 volts.

In the second device, all regions were the same as in the first device except region 222 had a thickness of 7 mils and a resistivity of 100 ohm-cm. This device had a switching voltage of 800 volts.

In a device of the type shown in FIG. 6, the base region 222 may vary from about 0.1 mil to 20 mils and be doped to a concentration of from $10^{13}$ to $10^{19}$ atoms per cc. of semiconductor material.

The important feature is that the base region (region 222) thickness and resistivity is such that at the desired switching voltage the base is substantially in the punch-through condition. That is, that the depletion width of the central junction (junction 226) has extended substantially through the base region (region 222).

In the following Table typical electrical characteristics of the two devices embodying the teachings of this invention are set forth.

| Electrical parameter | Avalanche | Punch through |
|---|---|---|
| Forward current (avg.), amp | 15 | 10 |
| Switching voltage ($V_{BO}$), v | 400–1,400 | 150–1,000 |
| Switching current ($I_{BO}$), ma | 200–1,000 | 2–100 |
| Forward voltage drop ($V_F$), v. at 30 amp | 1.1 | 1.1 |
| Reverse voltage drop ($V_{FR}$), v. at 30 amp | 1.5–2.0 | 1.5–2.0 |
| Reverse leakage (150° C. at 60% $V_{BO}$), ma | 1–3 | 1–3 |
| Reverse turn-on time (to 1,000 A.), nsec | 500 | 500 |
| Maximum junction operation temperature (° C.) | 190 | 150 |
| Maximum storage temperature (° C.) | 200 | 200 |
| *di/dt* rating, amp./μsec | 8,000 | 8,000 |
| Maximum thermal impedance junction to case, ° C./watt | 0.7 | 0.7 |

In devices designed to switch at high voltages, as for example at 1,000 volts, it may be desirable to reduce the sensitivity of the device by employing more than one central portion, consisting of a four-layer switch, in the same body of semiconductor material.

Figure 7:
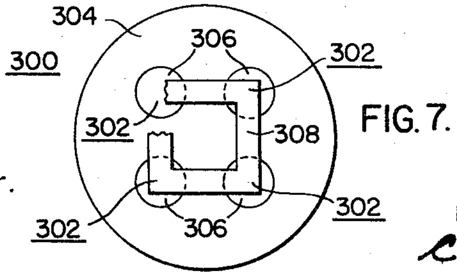
FIG. 7 is a top view of a device of this invention.

With reference to FIG. 7, there is shown a top view of such a device 300.

The device has a plurality of four region switches 302 completely surrounded by a diode 304.

The emitters 306 of each switch portion 302 are shorted to the diode portion 304 by an ohmic contact 308 which in turn connects the switch portions 302 together.

The *di/dt* capability of the device of this invention together with the short delay time and forward conducting features makes the device suitable for use in radar modulator circuits, as a replacement for gas switch tubes and as a transientproof rectifier.

Since numerous changes may be made in the above-described devices and different embodiments of the invention may be made without departing from the spirit thereof, it is intended that all matter contained in the foregoing description or shown in the drawings shall be interpreted as illustrative and not in a limiting sense.

I claim as my invention:

1. A semiconductor device consisting of; a body of semiconductor material, said body having a central portion and a peripheral portion, said peripheral portion surrounding said central portion, said central portion consisting of only four successively adjacent regions of alternate type semiconductivity, said first and said third regions being of a first-type of semiconductivity and said second and said fourth regions being of a second-type of semiconductivity, a PN junction between each of said regions, said peripheral portion consisting of only a first region and a second region, said first and said second region being of opposite type of semiconductivity, a PN junction between said first and said second region, said first region of said peripheral portion being of the same type of semiconductivity as the second and fourth regions of said central portion and said second region of said peripheral portion being of the same type of semiconductivity as said first and third regions of said central portion and first contact means for electrically shorting only said first region of said central portion and said first region of said peripheral portion and second contact means for electrically shorting only said fourth region of said central portion and said second portion of said peripheral portion.

2. The device of claim 1 in which the PN junction between the first and second regions of the peripheral portion is an extension of the PN junction between the second and third regions of the central portion.

3. The device of claim 2 in which the first region of the peripheral portion is from 10 percent to 50 percent thicker than the second region of the central portion.

4. The device of claim 2 in which the first region of the peripheral portion is from 30 percent to 50 percent thicker than the second region of the central portion.

5. The device of claim 1 in which the body of semiconductor material containing the device is cylindrical and the central portion is cylindrical and surrounded by a peripheral portion which is cylindrical.

6. A reverse switching rectifier semiconductor device consisting of a body of semiconductor material, said body having a central portion and a peripheral portion, said peripheral portion surrounding said central portion, said central portion consisting of four regions of alternate type semiconductivity, said first and said third regions being of a first-type of semiconductivity and said second and said fourth regions being of a second-type of semiconductivity, a PN junction between each of said regions, said peripheral portion consisting of a first region and a second region, said first and said second regions being of opposite type of semiconductivity, a PN junction between said first and said second region, said first region of said peripheral portion being of the same type of semiconductivity as the second and fourth regions of said central portion and said second region of said peripheral portion being of the same type of semiconductivity as said first and third regions of said central portion and means for electrically shorting said first region of said central portion to only said first region of said peripheral portion and said fourth region of said central portion to only said second portion of said peripheral portion, the third region of said central portion having a predetermined thickness and being doped to provide a given resistivity, whereby upon applying a potential between said means for electrically shorting the regions, so as to reverse bias the PN junction between the second and the third regions, whereby to cause a depletion layer to form, said depletion expanding in proportion to said reverse bias potential so as to cause the device to switch at a selected voltage dependent upon said thickness and the doping level of said third region.

7. The device of claim 5, wherein the thickness of said third region is from 0.1 mil to 20 mils.

8. The device of claim 6 wherein the doping in said third region provides from $10^{13}$ to $10^{19}$ atoms per cc.

9. A semiconductor device consisting of; a body of semiconductor material, said body having a central portion and a peripheral portion, said peripheral portion completely surrounding said central portion, said central portion consisting of a four region, three junction switching device, said peripheral portion consisting of a junction diode, said switching device being connected in a parallel circuit relationship with said junction diode.